(12) United States Patent
Liang et al.

(10) Patent No.: US 11,996,866 B2
(45) Date of Patent: May 28, 2024

(54) FEEDBACK CONTROL SYSTEM ACHIEVING HIGH PERFORMANCE VIA DENSITY MODULATION

(71) Applicant: xMEMS Labs, Inc., Santa Clara, CA (US)

(72) Inventors: Jemm Yue Liang, Sunnyvale, CA (US); Hsi-Sheng Chen, Fremont, CA (US); Chieh-Yao Chang, Taipei (TW); Hung-Chi Huang, Taoyuan (TW); Jing-Meng Liu, San Jose, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/178,552

(22) Filed: Mar. 6, 2023

(65) Prior Publication Data

US 2023/0299786 A1    Sep. 21, 2023

Related U.S. Application Data

(60) Provisional application No. 63/321,809, filed on Mar. 21, 2022, provisional application No. 63/339,394, filed on May 6, 2022.

(51) Int. Cl.
*H03M 3/00* (2006.01)

(52) U.S. Cl.
CPC ........... *H03M 3/454* (2013.01); *H03M 3/344* (2013.01); *H03M 3/452* (2013.01)

(58) Field of Classification Search
CPC ............... H03F 3/217; H03F 2200/351; H03F 2200/03; H03F 2200/331; H03F 3/2175; H03F 1/0205; H03F 1/32; H03F 1/523; H03F 2200/339; H03M 3/344; H03M 3/506; H03M 3/49; H03M 1/822; H03M 3/50; H03M 3/414; H03M 7/3004; H03M 5/08; H03M 7/3033
USPC ......................................... 341/143, 144, 161
See application file for complete search history.

(56) References Cited

U.S. PATENT DOCUMENTS

| 5,268,834 | A | 12/1993 | Sanner |
| 7,463,089 | B1 | 12/2008 | Bapat |
| 7,705,673 | B2* | 4/2010 | Teng ........................ H03F 1/523 330/207 P |
| 7,952,509 | B2 | 5/2011 | Aruga |
| 9,628,040 | B2* | 4/2017 | Lesso ........................ H03F 1/32 |

(Continued)

FOREIGN PATENT DOCUMENTS

| EP | 1895648 A2 * | 3/2008 | ............ H02M 3/158 |
| JP | 8-330967 A | 12/1996 | |

(Continued)

*Primary Examiner* — Linh V Nguyen
(74) *Attorney, Agent, or Firm* — Winston Hsu

(57) ABSTRACT

A feedback control system configured to drive a load is disclosed. The feedback control system includes an up-sampling circuit, configured to perform an un-sampling operation on a source signal and produce an up-sampled signal with an up-sampling frequency according to the up-sampled signal and a feedback signal from the load; a delta circuit, coupled to the up-sampling circuit and configured to produce a delta signal; a sigma circuit, configured to produce a density modulation signal according to the delta signal; and a driving device, configured to drive the load according to the density modulation signal with the up-sampling frequency.

29 Claims, 8 Drawing Sheets

(56) References Cited

U.S. PATENT DOCUMENTS

| | | | |
|---|---|---|---|
| 9,648,432 B2* | 5/2017 | Pan | H04R 29/001 |
| 9,897,516 B2 | 2/2018 | Bechhoefer | |
| 9,923,569 B1 | 3/2018 | Chen | |
| 9,985,646 B1 | 5/2018 | Mallett | |
| 2002/0122504 A1 | 9/2002 | Payne | |
| 2004/0232868 A1 | 11/2004 | Sawtell | |
| 2006/0091945 A1* | 5/2006 | Wegner | H03F 3/217 |
| | | | 330/10 |
| 2007/0195451 A1 | 8/2007 | Kokami | |
| 2008/0048628 A1 | 2/2008 | Lee | |
| 2008/0310200 A1* | 12/2008 | Maksimovic | H02M 3/1584 |
| | | | 363/65 |
| 2009/0237059 A1* | 9/2009 | Chiba | H02M 3/1588 |
| | | | 323/288 |
| 2011/0148677 A1* | 6/2011 | Ihs | H03F 3/2175 |
| | | | 341/143 |
| 2011/0248779 A1* | 10/2011 | Oddoart | H03F 3/217 |
| | | | 330/207 A |
| 2012/0133346 A1* | 5/2012 | Ogawa | H03M 1/182 |
| | | | 341/110 |
| 2014/0035628 A1* | 2/2014 | Oaklander | H02M 3/156 |
| | | | 327/109 |
| 2014/0085985 A1 | 3/2014 | Pan | |
| 2014/0320100 A1* | 10/2014 | Congiu | H02M 3/157 |
| | | | 323/282 |
| 2015/0002321 A1 | 1/2015 | Zhou | |
| 2015/0281836 A1* | 10/2015 | Nguyen | H03M 3/356 |
| | | | 381/120 |
| 2017/0294922 A1* | 10/2017 | Illing | H03M 1/38 |
| 2018/0248561 A1 | 8/2018 | Pullela | |

FOREIGN PATENT DOCUMENTS

| | | |
|---|---|---|
| JP | 2008-193160 A | 8/2008 |
| JP | 2009-130633 A | 6/2009 |
| JP | 2010-63055 A | 3/2010 |
| JP | 2011-258192 A | 12/2011 |
| JP | 2012-244579 A | 12/2012 |
| JP | 2013-211611 A | 10/2013 |
| JP | 2015-519778 A | 7/2015 |
| TW | I257804 | 7/2006 |

* cited by examiner

FEEDBACK CONTROL SYSTEM ACHIEVING HIGH PERFORMANCE VIA DENSITY MODULATION

CROSS REFERENCE TO RELATED APPLICATIONS

This application claims the benefit of U.S. Provisional Application No. 63/321,809, filed on Mar. 21, 2022. Further, this application claims the benefit of U.S. Provisional Application No. 63/339,394, filed on May 6, 2022. The contents of these applications are incorporated herein by reference.

BACKGROUND OF THE INVENTION

1. Field of the Invention

The present application relates to a feedback control system, and more particularly, to a feedback control system capable of achieving high performance.

2. Description of the Prior Art

Feedback control scheme is widely used in various applications, such as cruise control applications, robot control applications, temperature control applications, chemical process control applications, etc. Feedback control system usually comprises a loop formed by a summing block, a controller, a plant and a sensor. The sensor provides a feedback signal to the summing block according to a process variable (PV) of the plant which operates in accordance to a control variable (CV) provided by the controller.

In many cases, performance of the feedback control system relies on resolution and capability of the plant (or the sensor). For example, given the process variable usually lies in analog domain and the controller usually operates in quantized or digital domain, with finite resolution in the processing or step size of the plant, the sensor may comprise an analog-to-digital converter (ADC), and the performance of the feedback control system, e.g., SNR (signal-to-noise ratio) or SNDR (signal-to-noise-plus-distortion ratio), depends on the resolution of the ADC. In other words, for certain feasible and economically achievable resolution of the ADC and the processing step size resolution of the plant, in terms of response speed, power consumption or device size, the system SNR performance is limited.

Therefore, how to achieve/pursue performance above the inherent granularity and resolution of the plant is a significant objective in the field.

SUMMARY OF THE INVENTION

It is therefore a primary objective of the present application to provide a feedback control system capable of achieving high performance via density modulation, to improve over the prior art.

An embodiment of the present invention discloses a feedback control system configured to drive a load. The feedback control system comprises an up-sampling circuit, configured to perform an up-sampling operation on a source signal and produce an up-sampled signal with an up-sampling frequency; a delta circuit, coupled to the up-sampling circuit and configured to produce a delta signal according to the up-sampled signal and a feedback signal from the load; a sigma circuit, configured to produce a density modulation signal according to the delta signal; and a driving device, configured to drive the load according to the density modulation signal with the up-sampling frequency.

These and other objectives of the present invention will no doubt become obvious to those of ordinary skill in the art after reading the following detailed description of the preferred embodiment that is illustrated in the various figures and drawings.

DETAILED DESCRIPTION

In the present invention, the term "coupled to" may refer to direct or indirect connection. "Component A being coupled to component B" may indicate that component A is directly connected to component B, or component A is connected to component B via some component C.

Figure 1:
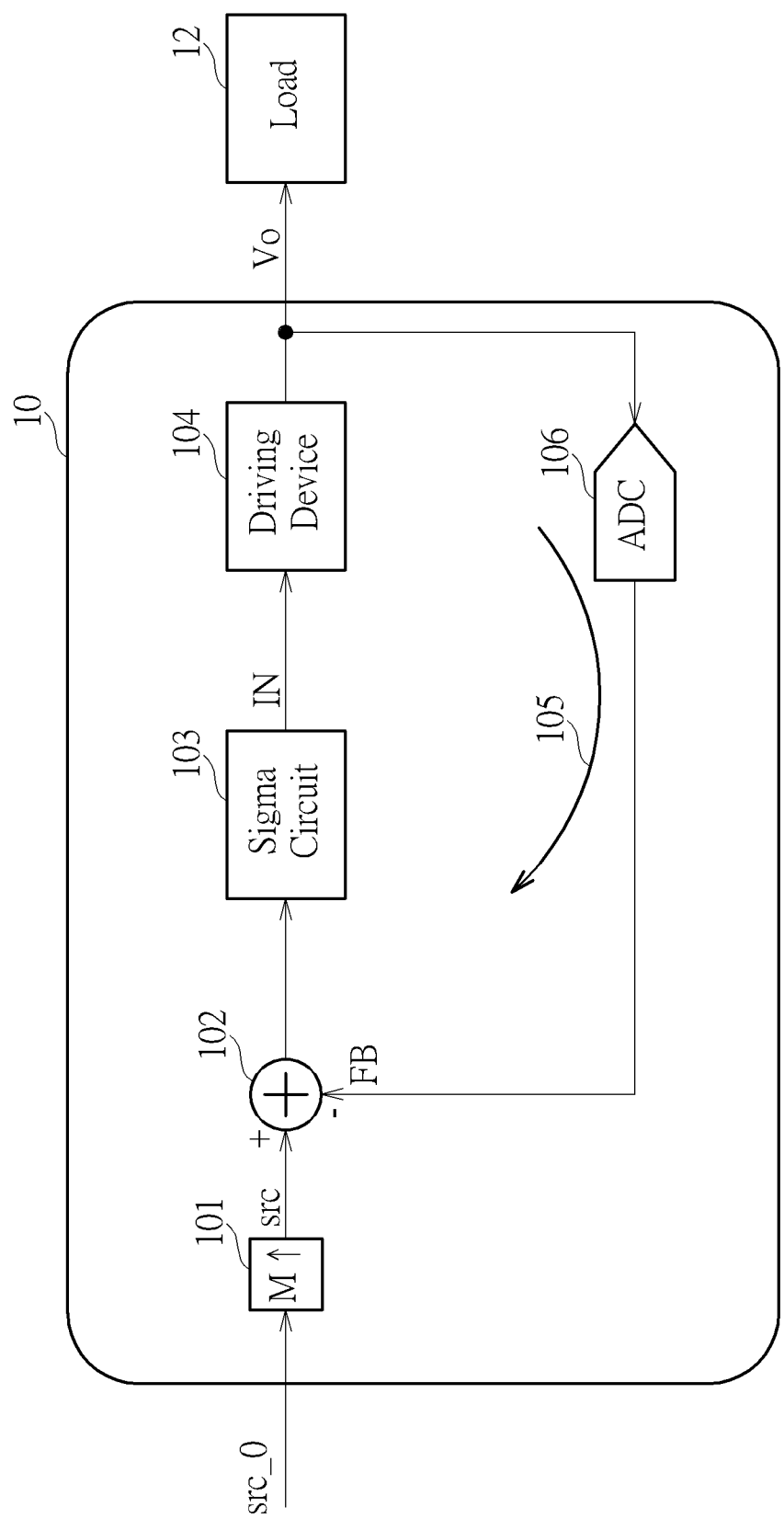
FIG. 1 is a schematic diagram of a feedback control system and a load according to an embodiment of the present application.

FIG. 1 illustrates a feedback control system 10 and a load 12 according to an embodiment of the present application. The feedback control system 10 receives a source signal src_0 and configured to drive the load 12 according to the source signal src_0. The feedback control system 10 may generate an output (signal) Vo to drive the load 12 according to the signal src_0. In general, while the feedback control system 10 operates, the feedback control system 10 may accumulate a certain quantity on the load 12, which will be specified later.

Generally speaking, the feedback control system 10 may be a tracking system. For example, the output signal Vo generated by the feedback control system 10 may track the signal src_0 with a certain accuracy by achieving a certain performance in terms of, e.g., SNDR (signal-to-noise-plus-distortion ratio), SQNR (signal-to-quantization-error-plus-noise ratio), or SNR (signal-to-noise ratio) in general. The load 12 may be or comprise an actuator. The feedback control system 10 and the load 12 may be used in various applications, such as cruise control applications, robot control applications, temperature control applications, chemical process control applications, which are not limited thereto. In the present application, SNR, SNDR, SQNR are used interchangeably, and SNDR/SQNR may be referred by SNR in general.

In an embodiment, the feedback control system 10 and the load 12 may form an audio driving system, the load 12 may be MEMS (Micro-Electro-Mechanical System) speaker or piezoelectric-actuated speaker, and the source signal src_0 is an audio source signal. The feedback control system 10 may be coupled to top and bottom electrodes of the piezo actuator. Note that, the load 12 may be the capacitance of the piezoelectric-actuated speaker. While the feedback control system 10 operates, the feedback control system 10 may accumulate a quantity of electronic charges on the capacitive load 12, such that the output signal Vo generated by the feedback control system 10 may track the signal src_0.

As shown in FIG. 1, the feedback control system 10 comprises an up-sampling circuit 101, a delta circuit 102, a sigma circuit 103 and a driving device 104. The up-sampling circuit 101 is configured to perform an up-sampling operation on the source signal src_0 and produce an up-sampled signal src with an up-sampling frequency according to the source signal src_0, where the up-sampling frequency may correspond to an over-sampling ratio (OSR). For example, under the context of audio driving application, the source signal src_0 may correspond to a sampling rate as 44.1 KHz or 48 KHz, and the up-sampled signal src may correspond to a (up-)sampling rate as 768 KHz, 1536 KHz or even 3072 KHz, which are within scope of the present application and not limited thereto. The OSR (annotated as symbol M in FIG. 1) is suggested to be greater than 4.

The delta circuit 102, which may comprise (or be implemented by) a subtractor, is configured to perform a delta operation and produce a delta signal according to the up-sampled signal src, and the sigma circuit 103 may perform a sigma operation (which can be a summation operation or a filtering operation) to produce a signal IN according to the delta signal. A loop 105, as a feedback control loop, is formed by the delta circuit 102 and the sigma circuit 103, and may be regarded as a delta-sigma ($\Delta\Sigma$) loop. The $\Delta\Sigma$ loop 105 has a noise transfer function (NTF) with a noise shaping effect. The noise shaping effect of the NTF of the $\Delta\Sigma$ loop 105 may be viewed as removing/shaping the noise energy/power from frequency band of interest (e.g., for sound processing application the frequency band of interest will be human audible band from 20 Hz to approximately 20 KHz to 24 KHz) toward high frequency band (e.g., beyond 96 KHz for sound processing application), and thus SNDR/SNR observed at the load within the frequency band/spectrum of interest is significantly improved. In short, the noise shaping effect of the $\Delta\Sigma$ loop 105 would improve SNDR/SNR performance over the frequency band of interest to the feedback control system 10.

Figure 2:
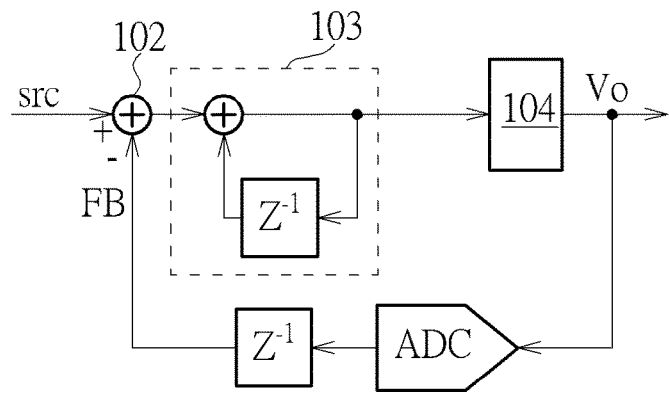
FIG. 2 is a schematic diagram of a sigma circuit according to an embodiment of the present application.
Figure 2:
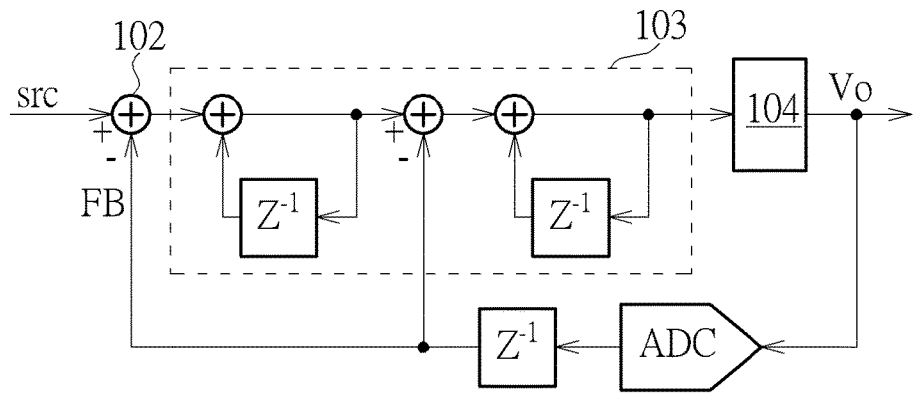
Figure 2:
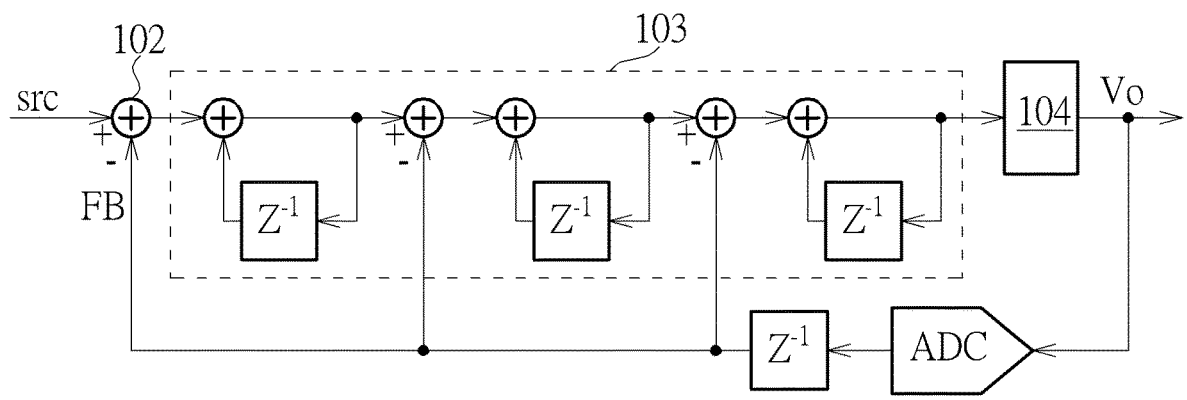
Figure 3:
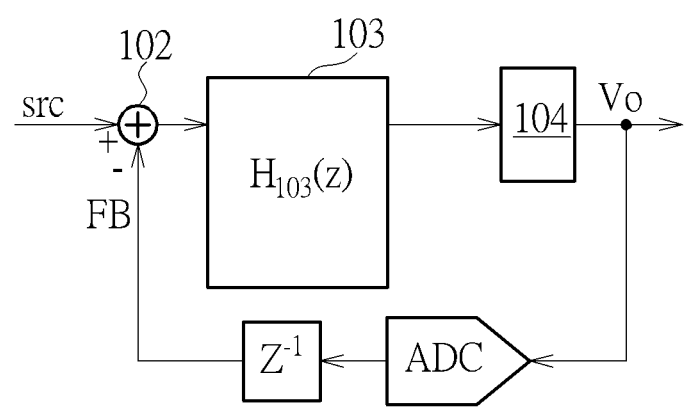
FIG. 3 is a schematic diagram of a sigma circuit according to an embodiment of the present application.

FIG. 2 illustrates three embodiments of the sigma circuit 103. As shown in FIG. 2, the sigma circuit 103 may comprise one or more integrator(s), and have a transfer function (in z-domain) as $1/(1-z^{-1})^L$, with integer $L \geq 1$. Hence, the loop 105 would have an NTF as $(1-z^{-1})^L$. FIG. 3 illustrates another embodiment of the sigma circuit 103, wherein the sigma circuit 103 is a digital infinite impulse response (IIR) filter with transfer function $H_{103}(z)$.

In FIG. 3, in order to improve stability of $\Delta\Sigma$ modulation performed by the loop 105, supposing that NTF of loop 105 has a high pass filtering (HPF) property which can be expressed as $NTF_{105}=H_{HPF}$, the transfer function may be expressed as $H_{103}(z)=1/NTF_{105}(z)-1=1/H_{HPF}(z)-1$, and NTF of loop 105 can be expressed as $NTF_{105}(z)=1/(1+H_{103}(z))$, where noise suppressed by $NTF_{105}$ may be brought by the driving device 104.

The driving device 104 may be interpreted as (part of) plant within feedback control system. In an embodiment, the driving device 104 may be realized by a circuit. In the present application, driving circuit may be referred to one kind of driving device, but not limited thereto. For various applications, the driving device 104 may not simply be a circuit. Any device configured to drive actuator (as load) may be interpreted as driving device. For example, vehicle/aircraft engine within a vehicle/aircraft cruise control may be viewed as a driving device, and heater within a thermostat system may be viewed as a driving device as well.

On the other hand, the driving device 104 either comprises no 2-bit quantizer or is not 2-bit quantizer itself. In the present application, the 2-bit quantizer refers to circuit or device which produces binary outputs, or outputs either logic 0 or logic 1. For example, a comparator may be regarded as a kind of 2-bit quantizer.

The loop 105, comprising the delta circuit 102 performing the delta operation and the sigma circuit 103 performing the sigma operation, is similar to the loop structure used for pulse density modulation (pure density modulation) or for signal density modulation (a hybrid of density modulation and amplitude modulation, abbreviated as SDM, which is taught in U.S. Pat. No. 11,303,295). In the present application, "density modulation signal" may generally refer to signal which is up-sampled and generated by or according to sigma circuit (e.g., 103) within the $\Delta\Sigma$ loop comprising delta and sigma circuits (e.g., 105). For example, the signal IN is a density modulation signal, and the signal Vo is a density modulation signal as well. Note that, the driving device 104 drives the load 12 according to the density modulation signal IN/Vo.

Practically, resolution or granularity achieved by the plant or the driving device is limited. Overshoots and undershoots caused by the driving device happen all the time. For SNR/SNDR-sensitive applications, e.g., audio driving application, such overshoots/undershoots bring unwanted error/distortion to the load. Thereby, system performance such as SNR/SNDR would be limited.

Thanks to the up-sampling operation and noise shaping/suppression capability of the $\Delta\Sigma$ loop 105, driving the load 12 according to the density modulation signal IN would significantly improve SNDR performance. Under the context of audio driving application, simulation results show that SNDR of the scenario using density modulation signal is improved by 15-20 dB, contributed by the noise shaping/suppression capability. As mentioned earlier, exploiting density modulation to drive actuator/load may be applied in various applications, and SNDR is expected to be significantly boosted, which is not limited to audio driving application.

However, driving load by density modulation signal (with high toggling rate) may consume excessive power whenever the load exhibits a capacitive or an inductive nature. For example, changing the voltage across the piezoelectric actuator of a MEMS speaker is capacitive, changing the temperature of a processing tank is capacitive, and changing the speed of a car is inductive.

Figure 4:
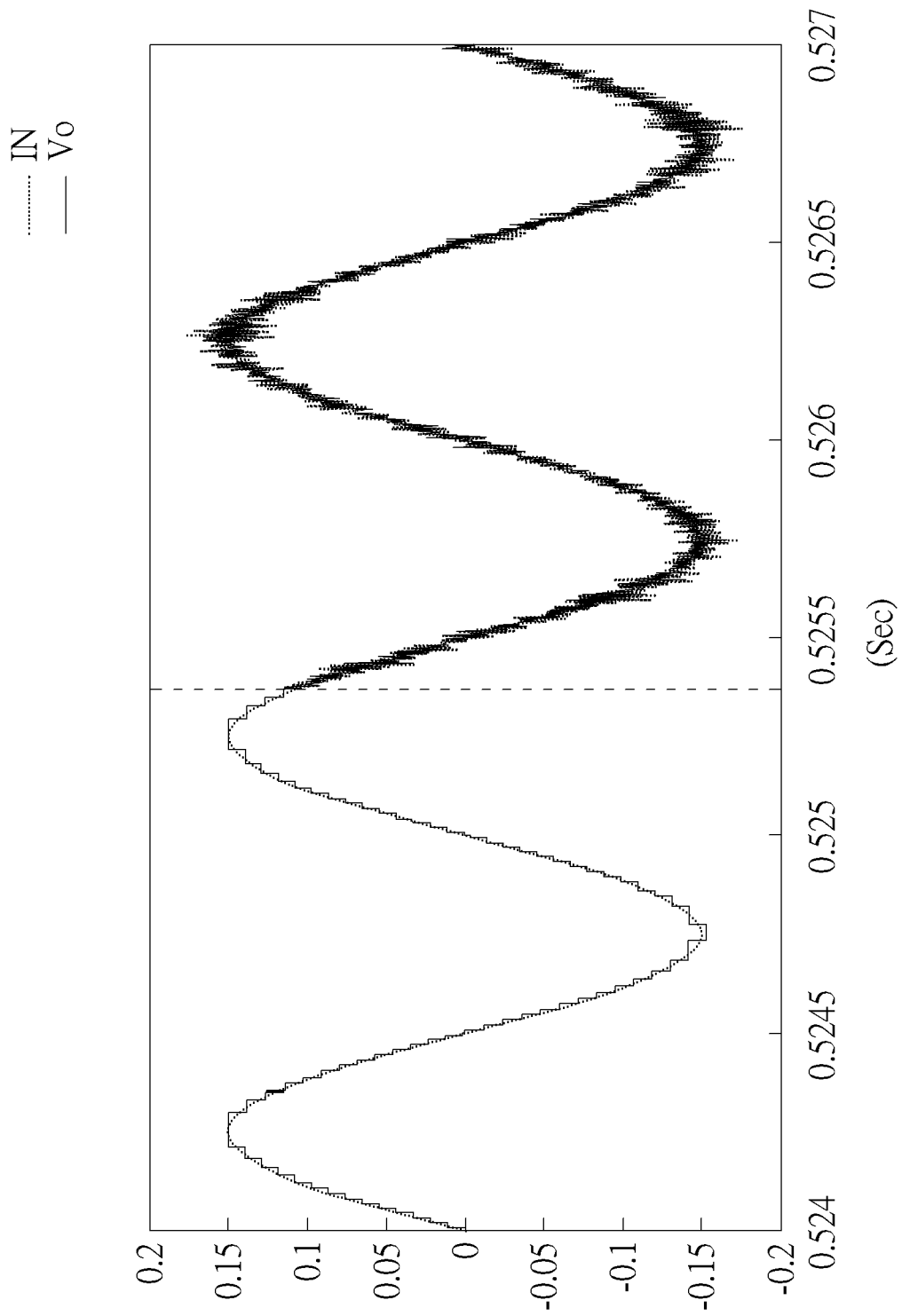
FIG. 4 illustrates waveforms of signals which are density modulated and waveforms of signals which have not been density modulated.

Note that, in order to benefit significantly from the noise reshaping of $\Delta\Sigma$ loop, the OSR needs to be high, which implies the up-sampling and $\Delta\Sigma$ operations will produce density modulation signals of high toggling rate. Illustratively, as shown in FIG. 4, the portion of FIG. 4 signal waveform to the left of the dotted vertical line illustrates the PCM modulated signals IN and Vo within the loop 105 when the $\Delta\Sigma$ operation is deactivated; the portion of FIG. 4 signal waveform to the right of the dotted vertical line illustrates the signals IN (input of the driving device 104) and Vo (output of the driving device 104) assuming the $\Delta\Sigma$ operation is activated. As can be seen from FIG. 4, the density modulation signals (e.g., IN and Vo) would have higher toggling rate, compared to which have not been density modulated (or without performing $\Delta\Sigma$ operation thereon).

When the load is (highly) capacitive, such as piezo MEMS speaker in audio driving application, in order to perform density modulation, which involves causing the required voltage toggles on the terminals of the speaker load, energy may need to be constantly and/or frequently injected-and-removed by amplifier (the driving circuit) at the up-sampling frequency. If in the energy-removing phase amplifier simply involves dumping the energy, e.g., to a ground, then the power consumption of the driving circuit would be dramatically high. In short, for the case of the load 12 being capacitive (e.g., the load 12 may be or comprise a piezo-electric-actuated speaker), using the density modulation signal Vo to drive the load 12 would consume more power, compared to the case where the capacitive load is driven by non-density modulated signal or by signal which is not generated via up-sampling and ΔΣ operations.

Resistive or slightly inductive load does not have such problem/issue. If the load is resistive or slightly inductive, then time averaging (within human audible band) of hybrid amplitude-density modulation scheme, such as SDM, is almost the same as amplitude modulation of higher bit-resolution, which means that the density modulation may not incur extra power consumption in amplifier (the driving circuit). And conventional driving circuits, e.g., class-AB, class-D, class-G or class-H amplifiers which do not have energy recycling capability and simply remove/drain the energy to a ground or to a negative power supply.

In other words, if the "energy removal" phase simply involves dumping the energy to GND, then the power consumption of the amplifier can increase dramatically. It is therefore paramount for the amplifier to recover the energy back to the power/voltage source during the "energy removal" phase, so that the energy can be reused in the "energy injection" phase of a subsequent voltage toggle cycle. Hence, it is desirable to incorporate a driving circuit with energy recycling capability into the system/circuit 10 which drives the load (e.g., 12) according to density modulation signal.

Figure 5:
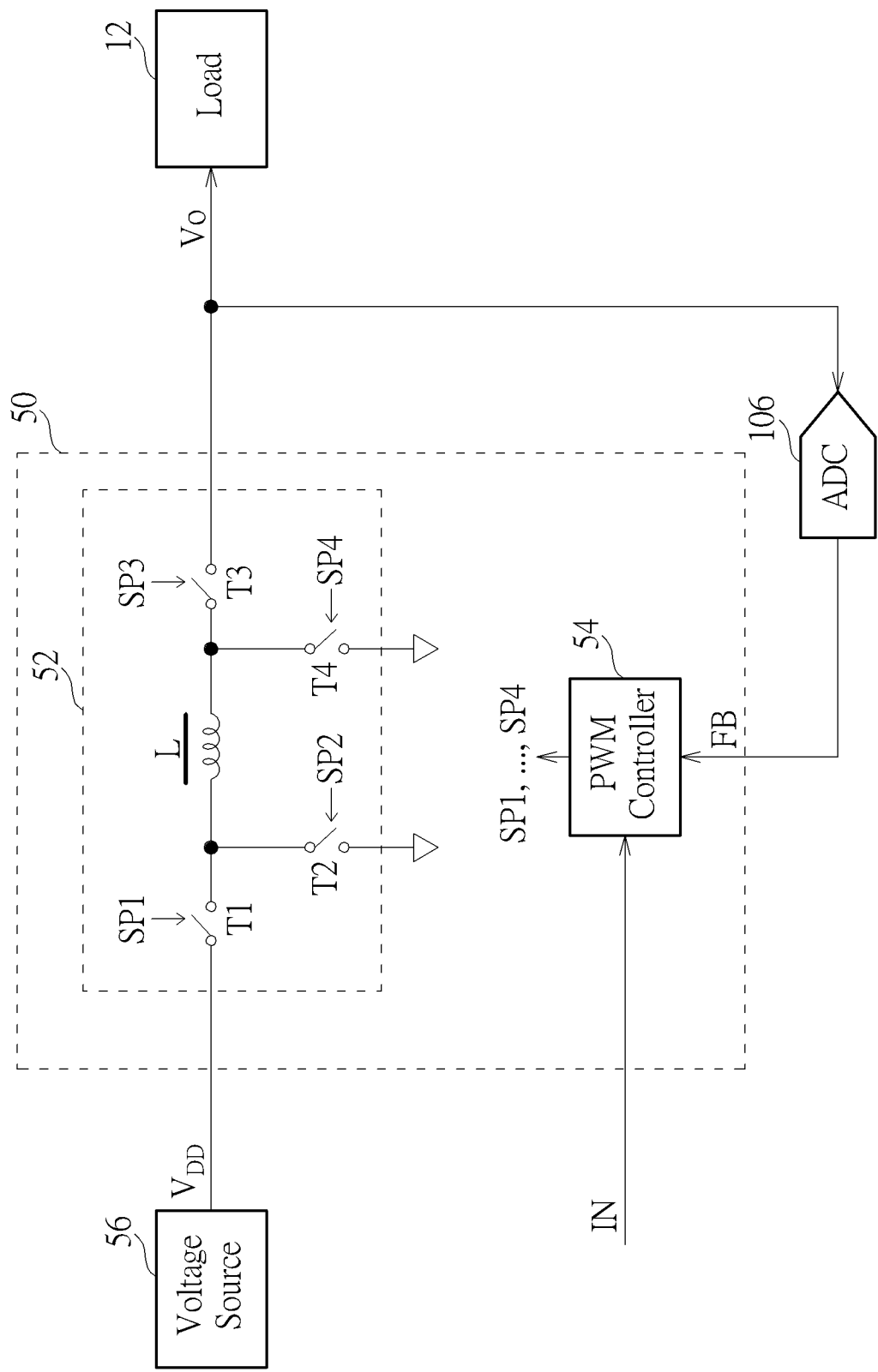
FIG. 5 is a schematic diagram of a driving circuit according to an embodiment of the present application.

FIG. 5 illustrates a driving circuit 50 according to an embodiment of the present application. The driving circuit 50 may be applied as the driving device 104, but not limited thereto. The driving circuit 50, coupled between a voltage source 56 and the load 12, comprises a switching circuit 52 and a pulse width modulation (PWM) controller 54. The switching circuit 52 comprises an inductor L and switches T1-T4. The switches T1-T2 are coupled to a first terminal of the inductor L, and the switches T3-T4 are coupled to a second terminal of the inductor L. The switch T1 is coupled to the voltage source 56, and the switch T3 is coupled to the load 12. The switches T1-T4 are controlled by PWM signals SP1-SP4, respectively.

In general, within the energy-injecting phase, the driving circuit 50 may perform a charging operation on the capacitive load and inject a current toward the capacitive load; within the energy-removing phase, the driving circuit 50 may perform a discharging operation on the capacitive load and drain a current out from the capacitive load.

For driving circuit with energy recycling capability, in an embodiment, during an InFlux sub-phase of the discharging operation, the switching circuit 52 transforms an electric energy stored in the capacitive load 12 into a magnetic (flux) energy stored in the inductor L; during a DeFlux sub-phase of the discharging operation, the switching circuit 52 transforms the magnetic energy stored in the inductor L into an electric energy stored in the voltage source 56.

In an embodiment, during an InFlux sub-phase of the charging operation, the switches T1, T4 are ON (conducted) and the switches T2, T3 are OFF (cutoff); during a DeFlux sub-phase of the charging operation, the switches T2, T3 are ON and the switches T1, T4 are OFF; during an InFlux sub-phase of the discharging operation, the switches T2, T3 are ON and the switches T1, T4 are OFF; during a DeFlux sub-phase of the discharging operation, the switches T1, T4 are ON and the switches T2, T3 are OFF.

In short, the driving circuit 50 with energy recycling capability would form/divert a current toward voltage source, to recycle the energy back to voltage source during the energy-removing/discharging phase.

Detail operations and variations of the switching circuit may be further referred to U.S. Pat. No. 11,336,182, which would not be narrated herein for brevity. Details of the energy-removing phase/operation or circuit topology of the switching/driving circuit are not limited thereto. For example, the driving circuit disclosed in U.S. Pat. No. 11,290,015 may be applied in the feedback control system 10. As long as the switching/driving circuit is able to transform an energy originally stored in the load into an energy stored in the voltage source during the energy-removing phase, requirement of the present application is satisfied, which is within the scope of the present application.

Figure 6:
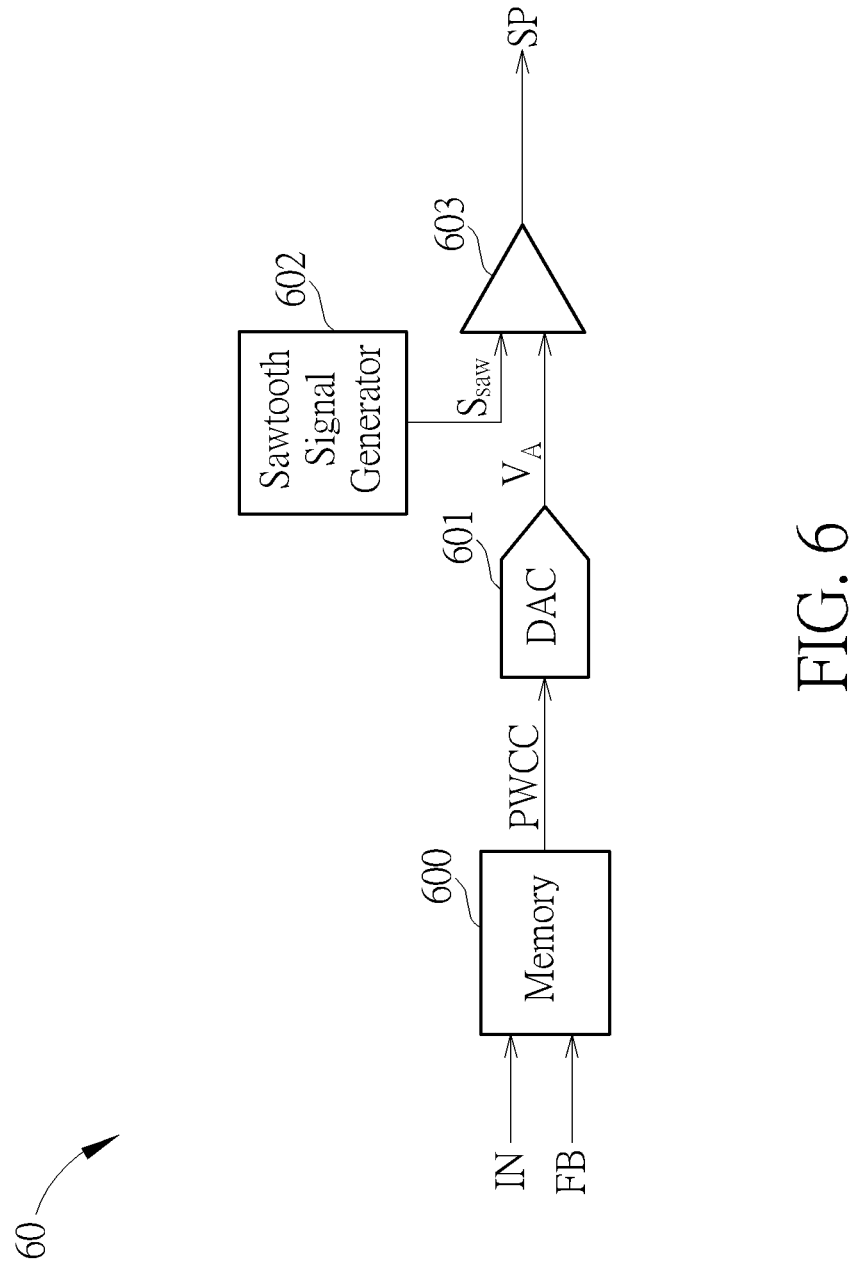
FIG. 6 is a schematic diagram of a PWM (pulse width modulation) controller according to an embodiment of the present application.

FIG. 6 illustrates a PWM controller 60 according to an embodiment of the present application. The PWM controller 60 may be applied as the PWM controller 54, but not limited thereto. The PWM controller 60 comprises a memory 600, a digital-to-analog converter (DAC) 601, a sawtooth signal generator 602 and a comparator 603. The memory 600 may comprise a look-up table providing pulse width control codes (PWCCs) for charging operation and a look-up table providing PWCCs for discharging operation. The DAC 601 generates an analog voltage $V_A$ according to the PWCC. The comparator 603 compares a sawtooth signal (or sawtooth-like signal) $S_{saw}$ generated by the sawtooth signal generator 602 with the analog voltage $V_A$, such that the PWM signal SP is generated. In this case, pulse width of the PWM signal SP would be proportional to the analog voltage $V_A$ as well as the PWCC. The PWM signal SP may be applied as at least one of the PWM signals SP1-SP4 (illustrated in FIG. 5).

Details of the PWM controller 60 may be referred to U.S. Pat. No. 11,271,480. The DAC 601 may be realized by the DAC disclosed in U.S. Pat. No. 11,251,802. In an embodiment, PWCCs stored in the look-up table may be retrieved/updated (via table learning) as taught in U.S. application Ser. No. 18/048,852. In an embodiment, the PWM controller disclosed in U.S. Pat. No. 11,290,015 may be applied as the PWM controller 54 as well.

In addition, when the ΔΣ operation is performed in digital domain, an analog-to-digital converter (ADC) 106 may be included within the feedback control system 10 or within the loop 105, as shown in FIG. 1. The ADC 106 is configured to convert Vo, which is usually analog and may be load voltage of the load 12, into digital format, such that the delta circuit 102 may perform the delta operation according to the up-sampled signal src and a feedback signal FB generated according to an output of the ADC 106.

Note that, the data length of/for the signals IN and FB may be adapted according to practical condition. For example, when a data length of the up-sampled signal src (e.g., the signal src may be in 24-bit) is larger than a data length of an ADC output codeword of ADC 106 (e.g., the ADC 106 may have 14-bit resolution), the 14-bit output codeword of the ADC 106 (which can be used/regarded as the feedback signal FB shown in FIG. 5) may be extended (as a 24-bit signal via, e.g., zero padding) to be provided to the delta circuit 102 as the feedback signal FB shown in FIG. 1. The ΔΣ operation of the loop 105 may be performed in/as 24-bit. Similarly, the 24-bit output of the sigma circuit 103 may be truncated to 14-bit to be provided to the driving device 104 as the signal IN.

Practically, there shall be a delay element, usually realized by register and expressed as $z^{-1}$ in z-domain, disposed on the feedback path or coupled between the ADC 106 and the delta circuit 102. The delay element is configured to maintain synchronous timing relationship between two inputs of the delta circuit, e.g., src and FB, which is omitted in FIG. 1 but shown in FIG. 2 and FIG. 3.

Note that, operation of ADC may be viewed as outputting digital ADC output codeword when analog ADC input is determined to be within a range between two thresholds corresponding to the ADC output codeword. For example, ADC may output a digital ADC output codeword K when an analog ADC input adc_in satisfies $th_{L,K} \leq adc\_in < th_{U,K}$, where $th_{L,K}/th_{U,K}$ are lower/upper analog thresholds defining the range corresponding to the output codeword K. However, ADC generally provides seldom information about how the ADC input adc_in distributes within the range, denoted as $[th_{L,K}, th_{U,K})$ for example. It is because no matter how adc_in distributes within the range $[th_{L,K}, th_{U,K})$, the ADC would output codeword K anyway, which means that how adc_in distributes within the range $[th_{L,K}, th_{U,K})$ would not be able to be observed by ADC with certain resolution.

Note that, how adc_in distributes within the range $[th_{L,K}, th_{U,K})$, related to ADC quantization error, indeed affects SNDR performance observed at a node denoted as Vo (shown in FIG. 1). It is because that, the ΔΣ operation effectively optimizes/enhances SNDR observed at the output terminal of ADC, instead of SNDR observed at the node Vo, where Vo and ADC output are distanced by quantization error, and thus SNDR observed at the output terminal of ADC shall be better than SNDR observed at the node Vo. In the present application, Vo may be interchangeably used for the notation of the output of the driving device 104 or for the notation of the node to which the driving device 104 and the load 12 are connected/coupled.

For example, under a simulation scenario of using 14-bit ADC and step size $\Delta V = Vpp/2^B$ with B=12 (where $\Delta V$ denotes a unit increment/decrement (or step size) for the driving circuit 50 and will be described later on), SNDR at the output terminal of ADC with the loop 105 can be achieved as 117 dB, but SNDR at the node Vo with ΔΣ operation is only 75 dB, even though the 75 dB SNDR at the node Vo with ΔΣ operation is already higher than SNDR of the case without performing ΔΣ operation or without using density modulation signal, where SNDR for the case without using density modulation is about 54-60 dB. Note that, given certain ADC resolution, there is a 15-21 dB performance gain by using the ΔΣ operation or the density modulation.

Note that, rather than enhancing SNDR at the output terminal of ADC, enhancing SNDR at the node Vo connected to the load is desirable. If information about how adc_in distributes within the range $[th_{L,K}, th_{U,K}]$ can be further extracted (or resolution be improved), difference between SNDR at ADC output terminal and SNDR at node Vo shall be reduced, which means that SNDR at node Vo would approaches SNDR at ADC output terminal, such that SNDR at node Vo is further enhanced.

In short, if an observability of the ADC 106 can be further enhanced, SNDR corresponding to an output terminal of the driving device 104 would be further enhanced. In the present application, obtaining more information on distribution of adc_in in the range $[th_{L,K}, th_{U,K}]$ (or gaining extra resolution in addition to the resolution pre-defined by specific ADC) may be referred to enhancing observability of ADC. There are several ways to enhance the observability of the ADC 106. One is to use an adaptive scaler.

Practically, a scaler may be included and be coupled between an output terminal of the driving device 104 and an input terminal of the ADC 106, when a swing of the output Vo of the driving device 104 is significantly different from a full scale input range of the ADC 106 (e.g., in terms of Vpp of the ADC 106). For example, a peak-to-peak swing of the output of the driving device 104 may be 31.2 V and the full scale input range of the ADC 106 may be 2.4 V. In this case, the scaler is configured to scale the output Vo of the driving device 104 down by a scaling factor SF, and the scaled output Vo/SF may be fed into the ADC 106, where SF may be 13 or 14 for example, depending on practical requirements. The scaler may be realized by resistor/capacitor ladder, as known in the art.

In order to enhance the observability of the ADC 106, the scaling factor SF may be adapted according to practical situations, e.g., according to an amplitude swing of the signal Vo or IN, or even according to an amplitude swing of the signal src.

Figure 7:
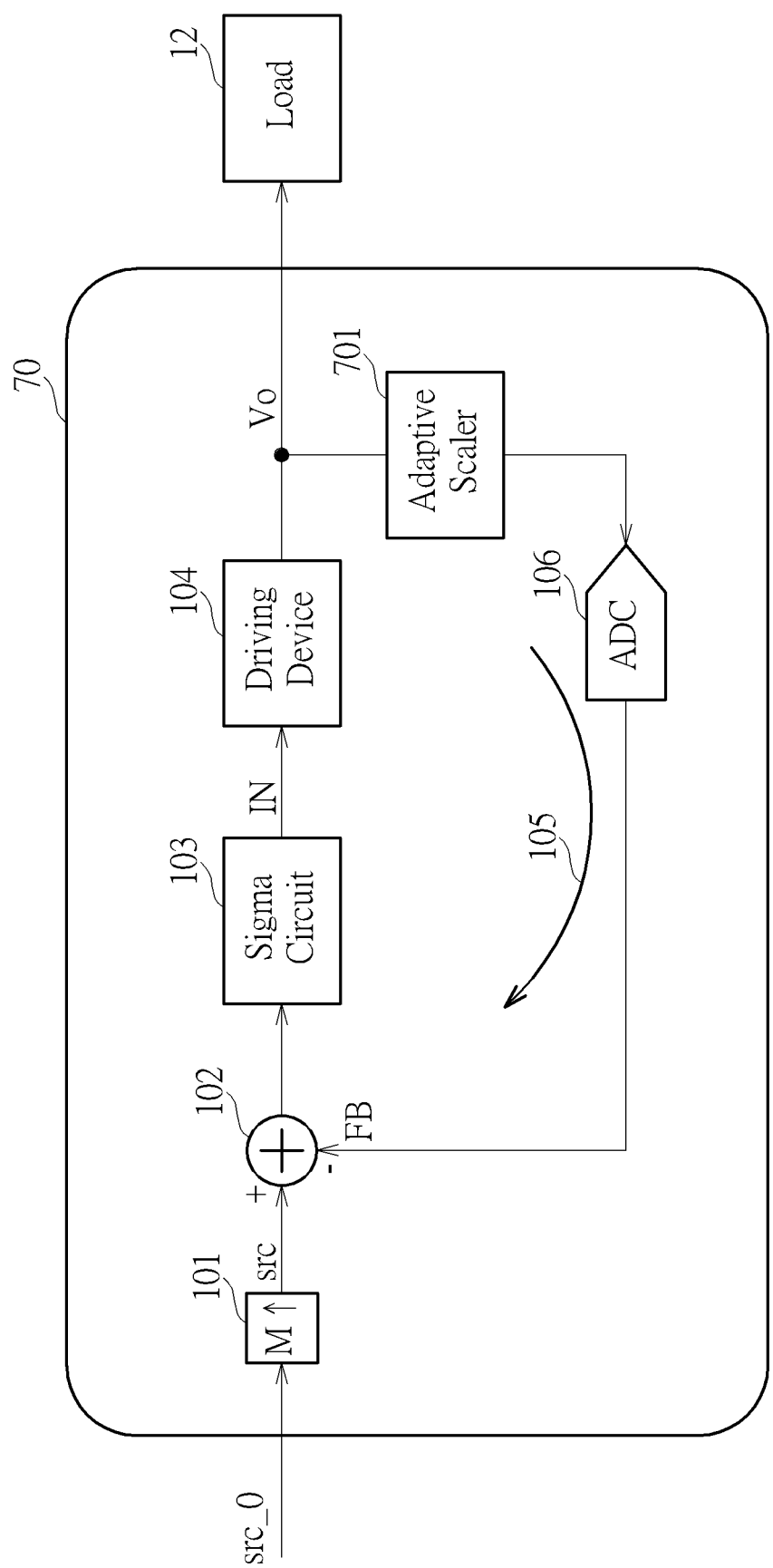
FIG. 7 is a schematic diagram of a feedback control system according to an embodiment of the present application.

FIG. 7 illustrates a schematic diagram of a feedback control system 70 according to an embodiment of the present application. The feedback control system 70 is similar to the feedback control system 10, and thus, same components are denoted by the same notations. Different from the feedback control system 10, the feedback control system 70 further comprises an adaptive scaler 701. The adaptive scaler 701 is configured to scale the signal Vo by a scaling factor SF and the scaling factor SF can be adaptively selected.

For example, when an amplitude swing of the signal Vo is sufficiently large or larger than a first threshold, the adaptive scaler 701 may scale the signal Vo down by a first scaling factor $SF_1$ (i.e., $SF=SF_1$). On the other hand, when the swing of the signal Vo is sufficiently small or smaller than a second threshold, the adaptive scaler 701 may scale the signal Vo down by a second scaling factor $SF_2$ (i.e., $SF=SF_2$), where $SF_1 > SF_2$. Numerically, in an embodiment, $SF_1$ may be 14 and $SF_2$ may be 3.5, which may be determined according to practical situation and not limited thereto. In an embodiment, more than two scaling factors can be adopted by the adaptive scaler 701, depending on practical design criterion.

Another approach to enhance observability is to obtain multiple ADC readouts and average the readouts. For example, the ADC 106 may perform multiple ADC operations and obtain multiple ADC readouts/outputs between two consecutive operating cycles of the driving device 104, and the ADC 106 (or an average circuit coupled between the ADC 106 and the delta circuit 102) may perform an average operation on the multiple ADC readouts and output an average result according to which the feedback signal FB is generated. For the driving device 104 being realized by the driving circuit 50, an operating cycle of the driving device 104 may be referred to a DC-DC (direct-current to direct-current) operating cycle in which a DC-DC operation comprising an InFlux sub-phase and a DeFlux sub-phase is accomplished. The DC-DC operation herein may be referred to either the charging operation or the discharging operation.

Figure 8:
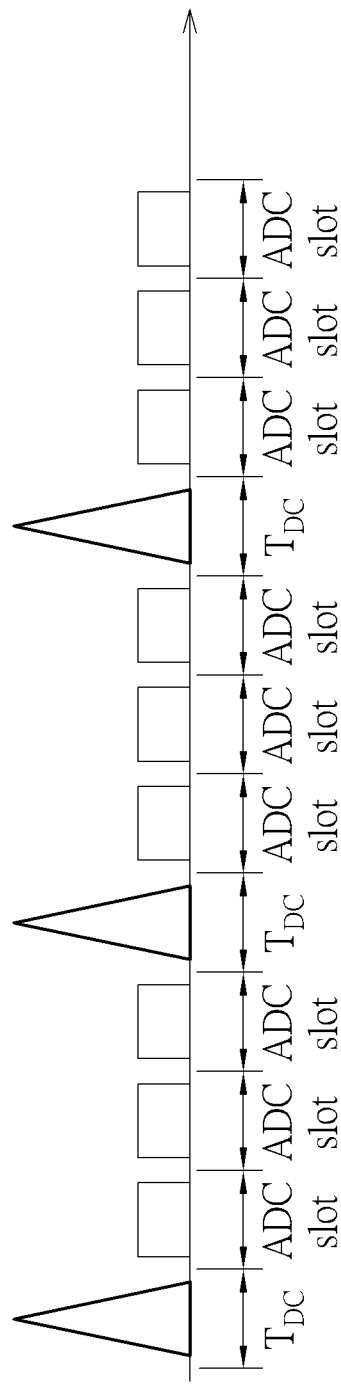
FIG. 8 illustrates a timing diagram of ADC slots and operating cycles.

FIG. 8 illustrates a timing diagram of an embodiment of present application. In FIG. 8, there are three ADC slots lying between two consecutive DC-DC operating cycles $T_{DC}$. Within one ADC slot, one ADC operation is performed once and one ADC readout is obtained. Within one DC-DC operating cycle $T_{DC}$, one DC-DC operation is performed. The ADC 106 may perform 2 (or 3) ADC operations within the two consecutive DC-DC cycles $T_{DC}$, obtain 2 (or 3) ADC readouts, and the ADC 106 (or the average circuit) may output an average result of the 2 (or 3) ADC readouts as the ADC output or as the feedback signal FB.

By averaging multiple ADC readouts, effect of ADC thermal noise may be averaged out and/or reduced, observability of the ADC 106 may be enhanced, and thus SNDR at the node Vo can be further enhanced.

For the audio driving application (e.g., by using the driving circuit 50 in FIG. 5 as the driving device 104 in FIG. 1), under a scenario of $V_{DD}$=2.7 V, L=330 nH, $\Delta V$=Vpp/$2^B$ with B=12 (where $\Delta V$ denotes a unit increment/decrement (or step size) for the charging/discharging look-up table and Vpp herein denotes a maximum amplitude swing of the load 12), the ADC 106 with 14-bit resolution, the loop 105 with $2^{nd}$ order $\Delta\Sigma$ operation, (an equivalent) SNDR at the node Vo may achieve as 99.1 dB for single ADC readout, achieve as 101.6 dB for averaging over 2 ADC readouts, and achieve as 102.9 dB for averaging over 3 ADC readouts. As can be seen, SNDR can be enhanced by the density modulation signal (or the $\Delta\Sigma$ operation) and by enhancing observability of the ADC.

In addition, due to energy recycle capability of the driving circuit (e.g., 50), the power consumption can be reduced. Furthermore, in order to reduce power consumption, some operations with the PWM controller 60 and the ADC 106 within an operation cycle may be skipped within an idle frame.

For example, as described in the U.S. Pat. No. 11,271,480, the PWM controller 60 may determine whether the driving circuit operates as an idle mode/status within an operation cycle. The idle frame may refer to the operation cycle in which the driving circuit performs neither charging operation nor discharging operation. In an embodiment, the operation cycle herein may refer to a reciprocal of the (up-) sampling rate of the up-sampled signal src.

Moreover, within the idle frame, the DAC 601, the sawtooth signal generator 602, the comparator 603 and/or the ADC 106 may not operate. Table lookup and table learning operations of the look-up table stored in the memory 600 may not be perform as well. As a result, no current will flow into or out of the load. Hence, for capacitive load, power consumption of the feedback control system of the present application may be further reduced.

Under the audio driving application, power consumption of the feedback control system of the present application may be reduced significantly. For input signal level of the signal src_0/src is sufficiently low or lower than a threshold, a percentage of the idle frames within an operation period of the feedback control system of the present application may exceed 50%. For example, when input signal level of the signal src is as low as −80 dB of full scale, the percentage of the idle frame may be at least 63%.

Details of the unit increment/decrement (or step size) for the charging/discharging look-up table are elaborated in U.S. Pat. No. 11,271,480 and application Ser. No. 18/048,852.

Moreover, among the multiple ADC operations between two consecutive operating cycles, level shift(s) may be added on the analog ADC input adc_in. Level shift(s) may have a magnitude of LSB/2 or LSB/3, where LSB herein represents an analog voltage/value corresponding to a least significant bit of the ADC. For example, the ADC 106 may perform a first ADC operation according to adc_in and perform a second ADC operation according to adc_in+ LSB/2 or adc_in−LSB/2. An average of result of the first and second ADC operations may reflect a distribution of adc_in within the range [$th_{L,K}$, $th_{U,K}$), which is within the scope of the present application. In another embodiment, the ADC 106 may perform a first ADC operation according to adc_in, perform a second ADC operation according to adc_in+LSB/3, and perform a third ADC operation according to adc_in−LSB/3. An average of result of the first, second and third ADC operations may also reflect a distribution of adc_in within the range [$th_{L,K}$, $th_{U,K}$).

In addition, the ADC 106 may be realized by a SAR (Successive Approximation Register) ADC. In order to enhance observability, the ADC 106 may further exploit the existing multiple votes produced by conventional SAR ADC to gain extra resolution.

That is, instead of using majority rule to determine the single LSB according to the multiple votes (or multiple comparison results) as conventional SAR ADC, in the present application, the multiple votes or multiple comparison results may be further exploited to extract more information about how adc_in distributes within certain range.

Specifically, an N-bit SAR ADC, which comprises a threshold generator and a comparator, performs (N−1) times of first comparisons on the analog ADC input adc_in with thresholds $V_{th,(N-1)}, \ldots, V_{th,1}$ to determine (N−1) most significant bits, denoted as [$b_{N-1}, \ldots, b_1$], where the plurality of first thresholds $V_{th,(N-1)}, \ldots, V_{th,1}$ are determined by the threshold generator via, as known in the art, binary search (tree) algorithm. A second threshold $V_{th,0}$ is determined by the threshold generator after bit $b_1$ is determined. The N-bit SAR ADC would perform multiple second comparisons on the analog ADC input adc_in with the (single) second threshold $V_{th,0}$ to obtain the multiple comparison results.

For the comparison performed by the ADC, it is inherently assumed that the analog ADC input adc_in is polluted by AFE noise or thermal noise before the comparisons are performed, and the comparisons would be affected by comparator noise therein.

Conventional SAR ADC uses majority rule to determine the single least significant bit $b_0$ according to the multiple comparison results. For example, if majority of the multiple comparison results indicate that adc_in>$V_{th,0}$, then the conventional SAR ADC determines $b_0$=1; otherwise, SAR ADC determines $b_0$=0.

In comparison, the ADC 106 of the present application, different from conventional N-bit SAR ADC, may obtain multiple least significant bits, denoted as [$b_0, f_1, \ldots, f_M$], according to the multiple comparison results and produce an ADC output codeword as [$b_{N-1}, \ldots, b_0, f_1, \ldots, f_M$]. The ADC 106 may comprise a counter or a lookup table to obtain the multiple least significant bits [$b_0, f_1, \ldots, f_M$] according to the multiple comparison results.

For example, the ADC 106 may comprise the counter to obtain a counting result representing how many times the multiple comparison results indicate that adc_in>$V_{th,0}$, and determine the multiple least significant bits [$b_0, f_1, \ldots, f_M$] according to the counting result. Furthermore, the ADC 106 may use the counting result as an index to look up the lookup table to obtain the multiple least significant bits [$b_0, f_1, \ldots, f_M$]. The lookup table may be established according to stochastic distribution of thermal/comparator noise within the ADC 106. Rationale and detail operation(s) of exploiting the multiple comparison results to the multiple least significant bits [$b_0, f_1, \ldots, f_M$] may be referred to U.S. application Ser. No. 18/171,687, which are not narrated herein for brevity.

By exploiting the SAR ADC disclosed in U.S. application Ser. No. 18/171,687 (denoted as SARX-ADC) within the loop 105 in the feedback control system of the present application, in the same scenario described above, the SNDR at the node Vo may be further enhanced to 103.6-104.5 dB (under single ADC readout), depending on various SARX-ADC configurations. As shown, it would be 4.5-5.4 dB performance gain in terms of SNDR by exploiting SARX-ADC disclosed in Ser. No. 18/171,687.

As a result, applying SARX-ADC, which provides extra resolution via the (fractional) bits $[f_1, \ldots, f_M]$ in addition to the (integer) bits $[b_{N-1}, \ldots, b_0]$, would bring performance gain in terms of SNDR, especially under the context involving $\Delta\Sigma$ operation or density modulation.

In summary, the feedback control system utilizes the $\Delta\Sigma$ circuits/operations to enhance system performance; utilizes the driving circuit with energy capability to reduce power consumption; utilizes the ADC with better observability to further improve system performance. Hence, the feedback control system of the present application is able to achieve high system performance and low power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A feedback control system, configured to drive a load, the feedback control system comprising:
    an up-sampling circuit, configured to perform an un-sampling operation on a source signal and produce an up-sampled signal with an up-sampling frequency;
    a delta circuit, coupled to the up-sampling circuit and configured to produce a delta signal according to the up-sampled signal and a feedback signal from the load;
    a sigma circuit, configured to produce a density modulation signal according to the delta signal; and
    a driving device, receiving the density modulation signal and the feedback signal from the load, configured to drive the load according to the density modulation signal with the up-sampling frequency and the feedback signal from the load;
    wherein a loop is formed by the delta circuit and the sigma circuit;
    wherein the sigma circuit performs an operation on the delta signal to produce the density modulation signal, such that the loop formed by the delta circuit and the sigma circuit has a noise transfer function with a high pass filtering effect;
    wherein the noise transfer function with the high pass filtering effect is configured to remove a noise energy corresponding to a noise from a baseband toward a high frequency band, wherein the noise is brought by the driving device.

2. The feedback control system of claim 1, wherein the feedback control system accumulates a quantity on the load while the feedback control system operates.

3. The feedback control system of claim 1, wherein the load produces a load quantity, and the load quantity corresponding to a specific time is dependent on the load quantity corresponding to time before the specific time.

4. The feedback control system of claim 1,
    wherein the load is a capacitive load;
    wherein the feedback control system accumulates a quantity of electronic charges on the capacitive load while the feedback control system operates.

5. The feedback control system of claim 1, wherein the load comprises an actuator.

6. The feedback control system of claim 1, wherein the load is a speaker load.

7. The feedback control system of claim 1, wherein the source signal is corresponding to an audio signal.

8. The feedback control system of claim 1, wherein the driving device is within the loop corresponding to the noise transfer function with the high pass filtering effect.

9. The feedback control system of claim 1, wherein the sigma circuit comprises at least one integrator or a digital infinite impulse response (IIR) filter.

10. The feedback control system of claim 1, wherein the driving device is coupled between a voltage source and the load.

11. The feedback control system of claim 10,
    wherein the driving device transforms a first energy originally stored in the load into a second energy stored in the voltage source during an energy-removing phase.

12. The feedback control system of claim 10,
    wherein during a discharging operation, the driving device forms a current from the load toward the voltage source.

13. The feedback control system of claim 10, wherein the driving device comprises a switching circuit comprising a plurality of switches and a pulse width modulation (PWM) controller receiving the density modulation signal from the sigma circuit and the feedback signal from the load;
    wherein the PWM controller controls the plurality of switches according to the density modulation signal and the feedback signal from the load.

14. The feedback control system of claim 13, wherein the switching circuit comprises an inductor.

15. The feedback control system of claim 14, wherein the switching circuit comprises:
    a first switch, coupled between the voltage source and a first terminal of the inductor;
    a second switch, coupled to the first terminal of the inductor;
    a third switch, coupled between the load and a second terminal of the inductor; and
    a fourth switch, coupled to the second terminal of the inductor.

16. The feedback control system of claim 13, wherein the PWM controller generates PWM signals to control the switching circuit, such that the driving device performs a charging operation or a discharging operation.

17. The feedback control system of claim 13, wherein the PWM controller comprises a memory, a digital-to-analog converter (DAC), a sawtooth signal generator and a comparator.

18. The feedback control system of claim 17,
    wherein the memory comprises a look-up table providing pulse width control codes (PWCCs) for a charging operation or a discharging operation;
    wherein a table lookup operation or a table learning operation of the look-up table stored in the memory is not performed within an idle frame;
    wherein neither a charging operation nor a discharging operation is performed within the idle frame, and no current flows into or out of the load within the idle frame.

19. The feedback control system of claim 17,
    wherein at least one of the DAC, the sawtooth signal generator and the comparator does not operate within an idle frame;

wherein neither a charging operation nor a discharging operation is performed within the idle frame, and no current flows into or out of the load within the idle frame.

20. The feedback control system of claim 1, wherein a percentage of idle frames within an operation period of the feedback control system exceeds 50% when a signal level of the source signal is lower than a threshold.

21. The feedback control system of claim 1, comprising:
an analog-to-digital converter (ADC), coupled between the load and the delta circuit;
wherein the delta circuit receives the feedback signal generated according to an output of the ADC.

22. The feedback control system of claim 21, further comprising an adaptive scaler, coupled between the driving device and the ADC.

23. The feedback control system of claim 21, wherein the ADC performs multiple operations and obtains multiple outputs between two consecutive operating cycles, and the feedback signal is generated according to the multiple outputs of the ADC.

24. The feedback control system of claim 21, wherein the ADC is a Successive Approximation Register (SAR) ADC.

25. The feedback control system of claim 21,
wherein the ADC receives an analog input;
wherein the ADC performs a plurality of first comparisons on the analog input with a plurality of first thresholds to obtain a plurality of most significant bits of an ADC output codeword;
wherein the ADC performs a plurality of second comparisons on the analog input with a second threshold to obtain a plurality of least significant bits of the ADC output codeword.

26. The feedback control system of claim 21, wherein the ADC does not operate within an idle frame.

27. The feedback control system of claim 1, wherein the feedback control system is applied in an audio driving system, the load is a capacitive speaker load and the source signal is an audio source signal.

28. The feedback control system of claim 1, wherein the driving device is not 2-bit quantizer.

29. The feedback control system of claim 1, wherein the driving device forms a current flowing from the load to a voltage source when the driving device determines to perform a discharging operation according to the density modulation signal and the feedback signal.

* * * * *